United States Patent
Xi et al.

(10) Patent No.: US 7,939,188 B2
(45) Date of Patent: May 10, 2011

(54) MAGNETIC STACK DESIGN

(75) Inventors: Haiwen Xi, Prior Lake, MN (US); Antoine Khoueir, Apple Valley, MN (US); Brian Lee, Boston, MA (US); Pat Ryan, St. Paul, MN (US); Michael Tang, Bloomington, MN (US); Insik Jin, Eagan, MN (US); Paul E. Anderson, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 72 days.

(21) Appl. No.: 12/501,632

(22) Filed: Jul. 13, 2009

(65) Prior Publication Data

US 2010/0102406 A1 Apr. 29, 2010

Related U.S. Application Data

(60) Provisional application No. 61/108,787, filed on Oct. 27, 2008.

(51) Int. Cl.
*G11B 5/39* (2006.01)
*H01F 10/08* (2006.01)
*H01L 43/08* (2006.01)
*H01L 43/12* (2006.01)

(52) U.S. Cl. ............ 428/811.1; 428/811.5; 360/324.11; 360/324.12; 360/324.2; 365/158; 257/421; 324/207.21

(58) Field of Classification Search .................. None
See application file for complete search history.

(56) References Cited

U.S. PATENT DOCUMENTS

| | | | |
|---|---|---|---|
| 6,548,114 B2 | 4/2003 | Mao | |
| 6,759,263 B2 | 7/2004 | Ying et al. | |
| 6,795,279 B2 | 9/2004 | Singleton | |
| 7,241,632 B2 | 7/2007 | Yang | |
| 7,307,876 B2 | 12/2007 | Kent et al. | |
| 7,486,552 B2 | 2/2009 | Apalkov | |
| 7,583,529 B2 | 9/2009 | Chen | |
| 7,688,615 B2 | 3/2010 | Ho | |
| 2004/0041182 A1 | 3/2004 | Tuttle | |
| 2004/0094785 A1* | 5/2004 | Zhu et al. | 257/295 |
| 2004/0157427 A1 | 8/2004 | Motoyoshi | |
| 2005/0276090 A1 | 12/2005 | Yamagishi | |
| 2007/0008661 A1* | 1/2007 | Min et al. | 360/324.1 |
| 2007/0187785 A1* | 8/2007 | Hung et al. | 257/421 |
| 2007/0188942 A1* | 8/2007 | Beach et al. | 360/324.2 |

(Continued)

FOREIGN PATENT DOCUMENTS

EP 1885006 2/2008

(Continued)

OTHER PUBLICATIONS

Han, X., Wen, Z., Wei, H., J. App. Phys., 103, 07E933-1 to 07E933-6, 2008.*

(Continued)

*Primary Examiner* — Kevin M Bernatz
(74) *Attorney, Agent, or Firm* — Campbell Nelson Whipps LLC

(57) ABSTRACT

A magnetic stack having a free layer having a switchable magnetization orientation, a reference layer having a pinned magnetization orientation, and a barrier layer therebetween. The stack includes an annular antiferromagnetic pinning layer electrically isolated from the free layer and in physical contact with the reference layer. In some embodiments, the reference layer is larger than the free layer.

14 Claims, 7 Drawing Sheets

U.S. PATENT DOCUMENTS

| | | | |
|---|---|---|---|
| 2008/0225585 A1* | 9/2008 | Ranjan et al. | 365/173 |
| 2008/0265347 A1* | 10/2008 | Iwayama et al. | 257/421 |
| 2009/0168506 A1* | 7/2009 | Han et al. | 365/171 |
| 2009/0302403 A1 | 12/2009 | Nguyen | |
| 2010/0032777 A1* | 2/2010 | Gao et al. | 257/421 |
| 2010/0033880 A1 | 2/2010 | Dimitrov | |
| 2010/0053822 A1* | 3/2010 | Xi et al. | 360/324.2 |
| 2010/0102406 A1* | 4/2010 | Xi et al. | 257/421 |
| 2010/0109110 A1 | 5/2010 | Wang | |
| 2010/0117169 A1* | 5/2010 | Anderson et al. | 257/421 |

FOREIGN PATENT DOCUMENTS

| | | | |
|---|---|---|---|
| EP | 1885006 A1 * | 2/2008 | |

OTHER PUBLICATIONS

Han et al., Nanoring Magnetic Tunnel Junction and Its Application in Magnetic Random Access Memory Demo Devices with Spin-Polarized Current Switching, Journal of Applied Physics, vol. 13, No. 7, Mar. 26, 2008, pp. 7E933-1-7E933-6.

PCT Search Report and Written Opinion dated Oct. 25, 2010.
U.S. Appl. No. 12/200,034, filed Aug. 29, 2008, Inventor: Xi.
U.S. Appl. No. 12/233,764, filed Sep. 19, 2008, Inventor: Gao.
U.S. Appl. No. 12/268,638, filed Nov. 11, 2008, Inventor: Anderson.
Hayakawa, et al., "Effect of High Annealing Temperature on Giant Tunnel Magnetoresistance Ratio of CoFeB/MgO/CoFeB Magnetic Tunnel Junctions", Applied Physics Letters 89; 232510 (2006).
Ikeda, et al., "Giant TMR in CoFeB/MgO/CoFeB Magnetic Tunnel Junctions", Extended Abstracts on the 2007 International Conference on Solid State Devices and Materials, Tsukuba, pp. 746-747 (2007).
Kawahara et al., "2Mb Spin-Transfer Torque RAM (SPRAM) with Bit-by-Bit Bidirectional Current Write and Parallelizing-Direction Current Read", 2007 IEEE International Solid State Circuits Conference (2007).
Lee et al., "Effect of Electrode Composition on the Tunnel Magnetoresistance of Pseudo-Spin-Valve Magnetic Tunnel Junction with a MgO Tunnel Barrier", Applied Physics Letters 90, 212507 (2007).

* cited by examiner

MAGNETIC STACK DESIGN

RELATED APPLICATION

This application claims priority to U.S. provisional patent application No. 61/108,787, filed on Oct. 27, 2008 and titled "Memory Cell Structure for STRAM". The entire disclosure of application No. 61/108,787 is incorporated herein by reference.

BACKGROUND

Fast growth of the pervasive computing and handheld/communication industry has generated exploding demand for high capacity nonvolatile solid-state data storage devices. Current technology like flash memory has several drawbacks such as slow access speed, limited endurance, and the integration difficulty. Flash memory (NAND or NOR) also faces scaling problems. Also, traditional rotating storage (e.g., disc drives) faces challenges in areal density and in making components like reading/recording heads smaller and more reliable.

Resistive sense memories (RSM) are promising candidates for future nonvolatile and universal memory by storing data bits as either a high or low resistance state. One such memory, MRAM, features non-volatility, fast writing/reading speed, almost unlimited programming endurance and zero standby power. The basic component of MRAM is a magnetic tunneling junction (MTJ). MRAM switches the MTJ resistance by using a current induced magnetic field to switch the magnetization of MTJ. As the MTJ size shrinks, the switching magnetic field amplitude increases and the switching variation becomes more severe.

However, many yield-limiting factors must be overcome before resistive sense memory enters the production stage. One challenge is the magnitude of the switching current in a resistive sense memory array. In spin-torque transfer RAM (STRAM), this is dependent on several factors including characteristics of the barrier layer. Therefore, a need exists for designs that facilitate lower switching current.

BRIEF SUMMARY

The present disclosure relates to magnetic stacks (e.g., memory cells such as magnetic tunnel junction cells, and read sensors). The structures have a pinned reference layer configured for reduced interlayer coupling between the reference layer and the free layer. With these structures, high tunneling magnetoresistance (TMR) can be achieved.

In one particular embodiment, this disclosure describes a magnetic stack having a free layer having a switchable magnetization orientation, a reference layer having a pinned magnetization orientation, and a barrier layer therebetween, each of the free layer, reference layer and barrier layer having a center. The stack includes an annular antiferromagnetic pinning layer having a center, with the center of the pinning layer aligned with the center of each of the free layer, reference layer and barrier layer, the pinning layer electrically isolated from the free layer and in physical contact with the reference layer.

In another particular embodiment, this disclosure describes a magnetic stack having a free layer having a switchable magnetization orientation, a reference layer having a pinned magnetization orientation, and a barrier layer therebetween. The stack includes an antiferromagnetic pinning layer electrically isolated from the free layer and in physical contact with the reference layer. Each of the free layer, reference layer, barrier layer and pinning layer have a center and an outer diameter, with the reference layer having a larger outer diameter than the free layer.

In yet another particular embodiment, this disclosure describes a magnetic stack having a free layer having a switchable magnetization orientation, a synthetic antiferromagnetic (SAF) coupled reference layer having a pinned magnetization orientation, and a barrier layer therebetween. The SAF reference layer has a first ferromagnetic sublayer and a second ferromagnetic sublayer separated by a metallic spacer, with the first sublayer different than the second sublayer.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1A:
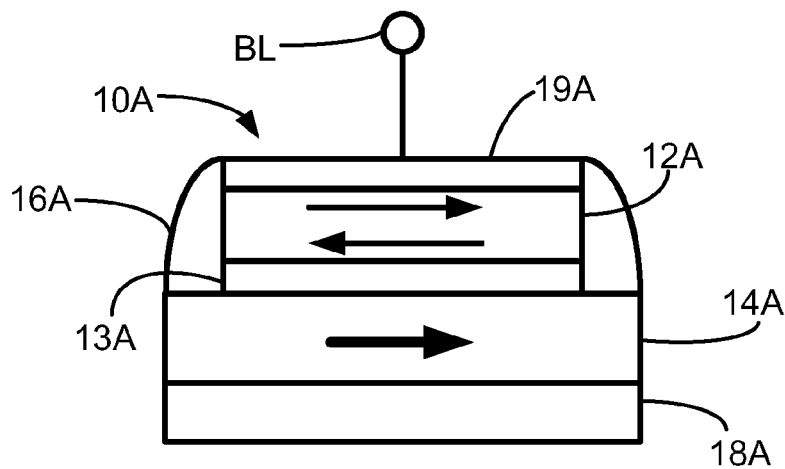
FIG. 1A is a cross-sectional schematic diagram of an illustrative magnetic stack with in-plane magnetization orientation.

This disclosure is directed to magnetic stacks (e.g., spin torque memory (STRAM) cells, RRAM cells, and other resistive sense memory cells (RSM cells) and read sensors). The structures have a pinned ferromagnetic reference layer, either a single layer or an SAF trilayer, that is larger than and extends past the ferromagnetic free layer. With such a structure, the interlayer coupling between the pinned reference layer and the free layer can be reduced, compared to a cell structure that has the same size for the reference layer and the free layer. Additionally, any electrical shorting issue at the edges of the ferromagnetic layers is inhibited. With these structures, high tunneling magnetoresistance (TMR) can be achieved. High TMR improves readability and writeability of memory arrays incorporated these memory cells.

In some embodiments, the magnetic cells include an annular antiferromagnetic pinning layer that is isolated from the free layer but in physical contact with the reference layer. In other embodiments, the magnetic cells include an asymmetric SAF trilayer.

In the following description, reference is made to the accompanying set of drawings that forms a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. Any definitions and descriptions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

It is noted that terms such as "top", "bottom", "above", "below", etc. may be used in this disclosure. These terms should not be construed as limiting the position or orientation of a structure, but should be used as providing spatial relationship between the structures.

While the present disclosure is not so limited, an appreciation of various aspects of the disclosure and of the invention will be gained through a discussion of the Figures and the examples provided below.

FIG. 1A is a cross-sectional schematic diagram of a magnetic cell 10A that includes a soft ferromagnetic free layer 12A and a ferromagnetic reference (i.e., pinned) layer 14A. Ferromagnetic free layer 12A and ferromagnetic reference layer 14A are separated by an oxide barrier layer 13A or non-magnetic tunnel barrier. Note that other layers, such as seed or capping layers, are not depicted for clarity but could be included as technical need arises.

Reference layer 14A is larger in size than free layer 12A and extends past the edges of ferromagnetic free layer 12A in at least one direction, often in at least two opposite directions. For a circular or nearly circular cell, each layer (e.g., free layer 12A, reference layer 14A, etc.) has a center point and an outer diameter. In some embodiments, reference layer 14A has a diameter greater than the diameter of free layer 12A, so that reference layer 14A extends past free layer 12A in all directions.

Ferromagnetic layers 12A, 14A may be made of any useful ferromagnetic (FM) material such as, for example, Fe, Co or Ni and alloys thereof, such as NiFe and CoFe. Ternary alloys, such as CoFeB, may be particularly useful because of their lower moment and high polarization ratio, which are desirable for the spin-current switch. Either or both of free layer 12A and reference layer 14A may be either a single ferromagnetic layer or a synthetic antiferromagnetic (SAF) coupled structure, i.e., two ferromagnetic sublayers separated by a metallic spacer, such as Ru or Cu, with the magnetization orientations of the sublayers in opposite directions to provide a net magnetization. The magnetization orientation of ferromagnetic free layer 12A is more readily switchable than the magnetization orientation of ferromagnetic reference layer 14A. Barrier layer 13A may be made of an electrically insulating material such as, for example an oxide material (e.g., $Al_2O_3$, $TiO_x$ or MgO). Other suitable materials may also be used. Barrier layer 13A could optionally be patterned with free layer 12A or with reference layer 14A, depending on process feasibility and device reliability.

A first or bottom electrode 18A is in electrical contact with ferromagnetic reference layer 14A and a second or top electrode 19A is in electrical contact with ferromagnetic free layer 12A. Electrodes 18A, 19A electrically connect ferromagnetic layers 12A, 14A to a control circuit providing read and write currents through layers 12A, 14A.

Radially encircling at least free layer 12A, is an isolation layer 16A, which is electrically insulating. In this embodiment, isolation layer 16A encircles free layer 12A, barrier layer 13A, and top electrode 19A. Isolation layer 16A has a thickness of about 2-30 nm and is formed of electrically insulating materials such as oxide(s) and nitride(s). Examples of suitable materials for isolation layer 16A include $Si_3N_4$, $SiO_2$, $SiO_xN_y$, SiOCN, $Ta_2O_5$, $Al_2O_3$, MgO, and other low K dielectrics. In other embodiments, isolation layer 16A encircles free layer 12A and top electrode 19A.

The resistance across magnetic cell 10A is determined by the relative orientation of the magnetization vectors or magnetization orientations of ferromagnetic layers 12A, 14A. The magnetization direction of ferromagnetic reference layer 14A is pinned in a predetermined direction while the magnetization direction of ferromagnetic free layer 12A is free to rotate under the influence of spin torque. Pinning of ferromagnetic reference layer 14A may be achieved through, e.g., the use of exchange bias with an antiferromagnetically ordered material such as PtMn, IrMn, and others.

Magnetic memory cell 10A is in the low resistance state when the magnetization orientation of free layer 12A is in the same direction (parallel) as the magnetization orientation of reference layer 14A. Conversely, a magnetic memory cell is in the high resistance state when the magnetization orientation of free layer 12A is in the opposite direction (anti-parallel) of the magnetization orientation of reference layer 14A. Switching the resistance state and hence the data state of magnetic cell 10A via spin-transfer occurs when a current, passing through a magnetic layer of magnetic cell 10A, becomes spin polarized and imparts a spin torque on free layer 12A. When a sufficient spin torque is applied to free layer 12A, the magnetization orientation of free layer 12A can be switched between two opposite directions and accordingly, magnetic cell 10A can be switched between the low resistance state and the high resistance state.

Figure 1B:
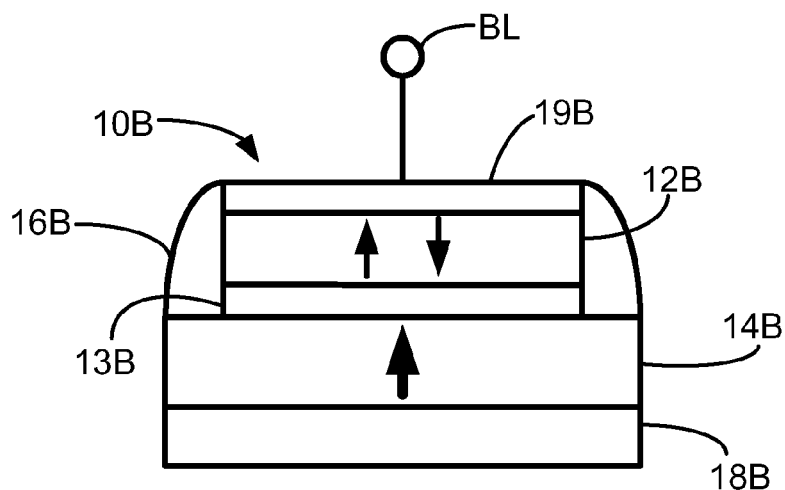
FIG. 1B is a cross-sectional schematic diagram of an illustrative perpendicular anisotropy magnetic stack with out-of-plane magnetization orientation.

The magnetization orientations of free layer 12A and reference layer 14A of magnetic memory cell 10A are in the plane of the layers, or "in-plane". FIG. 1B illustrates an alternate embodiment of a magnetic memory cell that has the magnetization orientations of the free layer and the pinned layer perpendicular to the plane of the layers, or "out-of-plane".

Similar to magnetic cell 10A of FIG. 1A, magnetic cell 10B of FIG. 1B has soft ferromagnetic free layer 12B and a ferromagnetic reference (i.e., pinned) layer 14B separated by an oxide barrier layer 13B or non-magnetic tunnel barrier. A first or bottom electrode 18B is in electrical contact with ferromagnetic reference layer 14B and a second or top electrode 19B is in electrical contact with ferromagnetic free layer 12B. Electrodes 18B, 19B electrically connect ferromagnetic layers 12B, 14B to a control circuit providing read and write currents through layers 12B, 14B. An electrically insulating radial isolation layer 16B encircles at least free layer 12A and top electrode 19B. The various elements of cell 10B are similar to the elements of cell 10A, described above, except that the magnetization orientations of layers 12B, 14B are oriented perpendicular to the layer extension rather than in the layer plane.

Free layer 12B and reference layer 14B each have a magnetization orientation associated therewith, illustrated in FIG. 1B. In some embodiments, magnetic cell 10B is in the low resistance state where the magnetization orientation of free layer 12B is in the same direction (parallel) as the magnetization orientation of reference layer 14B. In other embodiments, magnetic cell 10B is in the high resistance state where the magnetization orientation of free layer 12B is in the opposite direction (anti-parallel) as the magnetization orientation of reference layer 14B.

Similar to cell 10A of FIG. 1A, switching the resistance state and hence the data state of magnetic cell 10B via spin-transfer occurs when a current, passing through a magnetic layer of magnetic cell 10B, becomes spin polarized and imparts a spin torque on free layer 12B. When a sufficient spin torque is applied to free layer 12B, the magnetization orientation of free layer 12B can be switched between two opposite directions and accordingly, magnetic cell 10B can be switched between the low resistance state and the high resistance state.

Both memory cells 10A, 10B are illustrated with undefined magnetization orientations for free layer 12A, 12B. As indicated above, a magnetic memory cell is in the low resistance state when the magnetization orientation of free layer 12A, 12B is in the same direction as the magnetization orientation of reference layer 14A, 14B. Conversely, a magnetic memory cell is in the high resistance state when the magnetization orientation of free layer 12A, 12B is in the opposite direction of the magnetization orientation of reference layer 14A, 14B. In some embodiments, the low resistance state is the "0" data state and the high resistance state is the "1" data state, whereas in other embodiments, the low resistance state is "1" and the high resistance state is "0".

The magnet stack of memory cells 10A, 10B of FIGS. 1A and 1B can also be used as a magnetic read sensor in a hard disc drive with some modifications. In such uses, free layer 12A, 12B is influenced by a stored magnetic state on an adjacent recording media, and when a current is passed through the stack, the magnetization orientation in the media can be detected.

Figure 2:
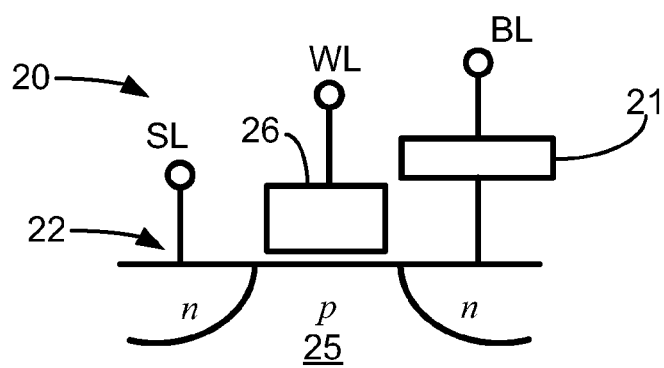
FIG. 2 is a schematic diagram of an illustrative memory unit including a memory cell and a semiconductor transistor.

FIG. 2 is a schematic diagram of an illustrative memory unit 20 including a memory element 21 electrically coupled to a semiconductor transistor 22 via an electrically conducting element. Memory element 21 may be any of the memory cells described herein. Transistor 22 includes a semiconductor substrate 25 having doped regions (e.g., illustrated as n-doped regions) and a channel region (e.g., illustrated as a p-doped channel region) between the doped regions. Transistor 22 includes a gate 26 that is electrically coupled to a word line WL to allow selection and current to flow from a source line SL to memory element 21 and bit line BL. An array of programmable metallization memory units 20 can be formed on a semiconductor substrate with word lines and bit lines utilizing semiconductor fabrication techniques. Both memory cell 10A of FIG. 1A and memory cell 10B of FIG. 1B are illustrated connected to a bit line BL via their top electrode 19A, 19B.

Figure 3:
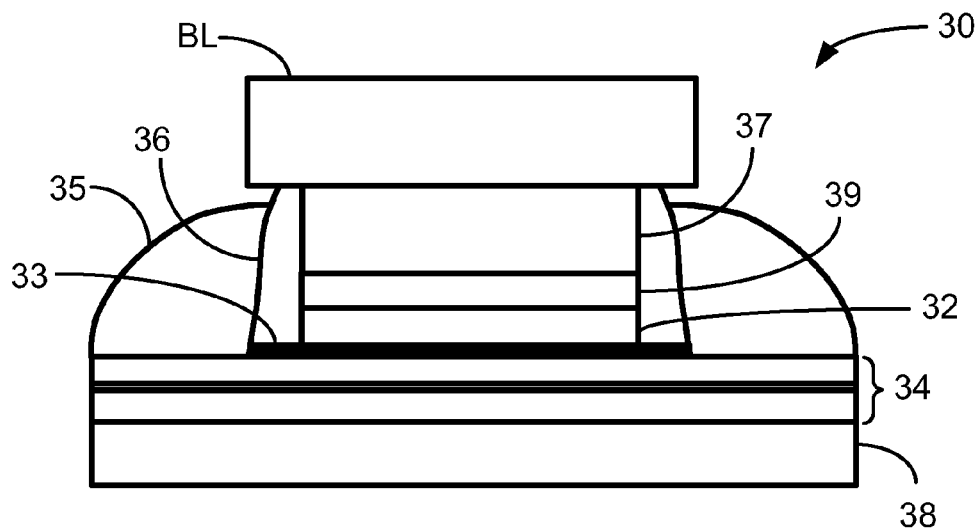
FIG. 3 is a cross-sectional schematic diagram of an embodiment of a magnetic cell.

FIG. 3 illustrates a first embodiment of a memory cell having a pinned SAF trilayer reference layer that is larger than and extends past the ferromagnetic free layer. This embodiment includes an antiferromagnetic pinning layer that is isolated from the free layer but in physical contact with the reference layer. The antiferromagnetic pinning layer is annular in some embodiments. In particular, memory cell 30 has a soft ferromagnetic free layer 32 and a SAF trilayer reference (i.e., pinned) layer 34 separated by a barrier layer 33. In some embodiments, barrier layer 33 is an oxide barrier layer, in other embodiments it can be a non-magnetic tunnel barrier. In one embodiment, trilayer 34 is composed of two layers of ferromagnetic material (e.g., CoFeB) separated by a layer of Ru, and barrier layer 33 is composed of MgO. A first or bottom electrode 38 is in electrical contact with trilayer 34 and a second or top electrode 39 is in electrical contact with ferromagnetic free layer 32. An electrically insulating isolation layer 36 encircles free layer 32 and top electrode 39. The various elements of cell 30 are similar to the element of cells 10A, 10B described above, except as noted.

Memory cell 30 also includes a hard mask 37 positioned above top electrode 39. In some embodiments, hard mask 37 is electrically conducting and is integral with or replaces top electrode 39. Memory cell 30 also includes an antiferromagnetic pinning layer 35 radially encircling the stack of barrier layer 33, free layer 32 and top electrode 39 and electrically insulated therefrom by isolation layer 36. In the illustrated embodiment, a portion of isolation layer 36 is exposed and not encircled by pinning layer 35. Free layer 32 is physically and electrically isolated from pinning layer 35, which is in physical contact with trilayer 34 at its extended area (i.e., proximate the outer diameter of trilayer 34) and provides pinning for SAF trilayer 34.

For memory cell 30, SAF trilayer 34 is larger than and extends past free layer 32; that is, trilayer 34 has a larger outer diameter than free layer 32. Trilayer 34 also is larger than and extends past barrier layer 33, which in turn is larger than and extends past free layer 32. Trilayer 34, barrier 33 and free layer 32 are stacked with their centers aligned.

Figure 4A:
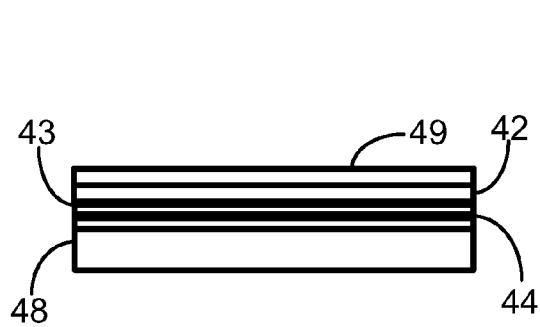
FIGS. 4A-4J illustrate a stepwise method for forming the magnetic cell of FIG. 3.
Figure 4B:
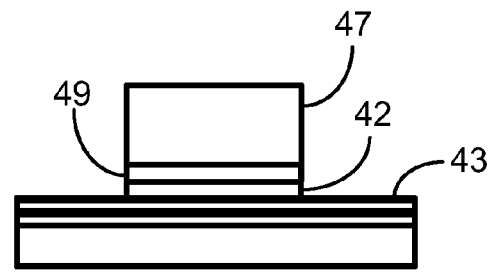
Figure 4C:
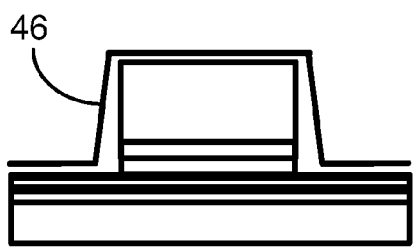

The process flow to make this memory cell stack structure is shown in FIGS. 4A-4J. First, in FIG. 4A, a stack of appropriate materials forming bottom electrode 48, SAF trilayer 44, barrier layer 43, free layer 42, and top electrode 49 is deposited. At this stage, high-temperature thermal annealing is done to induce the epitaxial formation in barrier layer 43 (e.g., MgO barrier layer) and crystallization of ferromagnetic free layer 42 and SAF trilayer 44. In FIG. 4B, a hard mask 47 is deposited on to top electrode 49 and then patterned. Subsequently, via milling and etching, free layer 42 is patterned and the etching is stopped at barrier layer 43. A protective layer 46, e.g., silicon nitride, is deposited in FIG. 4C to cover the stack of FIG. 4B. After milling and etching the structure of FIG. 4C, the extended area of SAF trilayer 44 is exposed in FIG. 4D while barrier layer 43 remains covered by protective isolation layer 46.

Figure 4D:
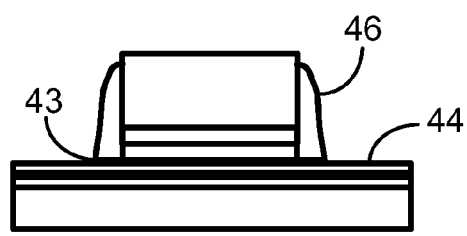
Figure 4E:
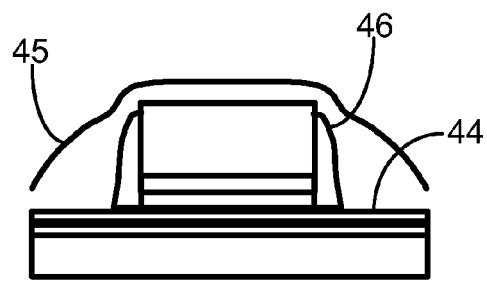
Figure 4F:
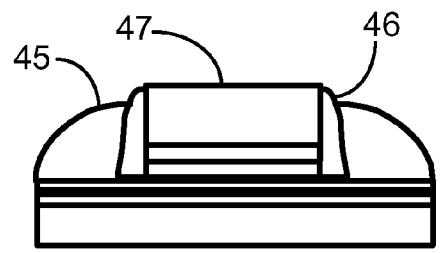

Then in FIG. 4E, an antiferromagnetic pinning layer 45 is deposited over the structure of FIG. 4D in contact with SAF trilayer 44 at the exposed area. In some embodiments, a very thin ferromagnetic layer may be deposited over the structure of FIG. 4D before deposition of antiferromagnetic pinning layer 45 to increase the pinning effect. Next in FIG. 4F, milling is performed to trim antiferromagnetic pinning layer 45 to achieve physical, electrical and magnetic separation between hard mask 47 and antiferromagnetic pinning layer 45. In some embodiments, for example, if pinning layer 45 is an insulator (e.g., NiO), this separation is not necessary. However, many pinning materials are metallic and are alloys of Mn, thus the separation is desired.

Figure 4G:
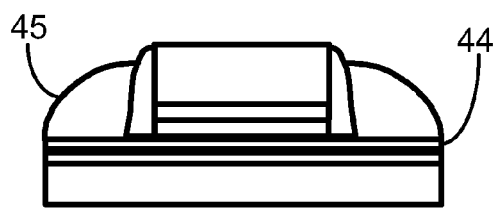

In FIG. 4G the entire stack is annealing at elevated temperature in the presence of a strong external in-plane magnetic field. If Mn is present in pinning layer 45, this annealing should be within a temperature range so that Mn diffusion is controlled. The magnetic field will align the magnetizations of SAF trilayer 44 in the field direction and will also induce exchange bias (pinning) of the top ferromagnetic layer of trilayer 44 (that is in contact with antiferromagnetic pinning layer 45). When the field annealing is completed, the resulting SAF trilayer 44 is pinned by antiferromagnetic layer 45.

Figure 4H:
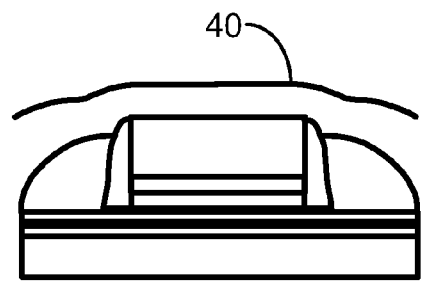
Figure 4I:
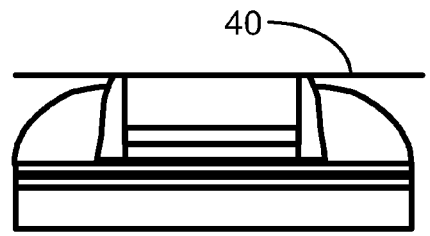
Figure 4J:
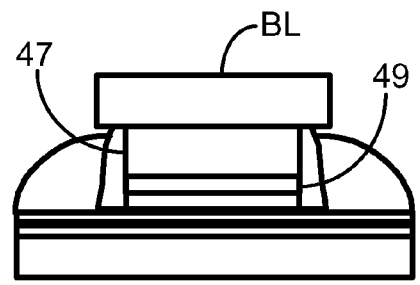

The memory cell is finalized by deposition of dielectric material 40 in FIG. 4H to encase the structure. This dielectric material 40 is polished in FIG. 4I to provide a planar surface, and a bit line BL is deposited and patterned on top electrode 49 and hard mask 47 in FIG. 4J.

Figure 5:
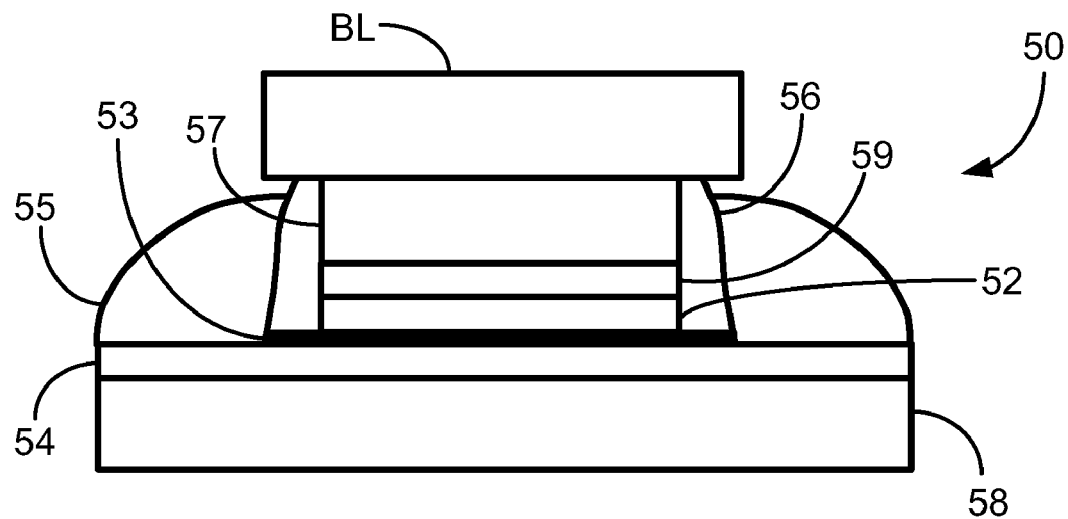
FIG. 5 is a cross-sectional schematic diagram of an embodiment of a magnetic cell.

FIG. 5 illustrates another embodiment of a memory cell having a pinned reference layer that is larger than and extends past the ferromagnetic free layer and having an annular pinning layer. In particular, memory cell 50 has a soft ferromagnetic free layer 52 and a single layer reference (i.e., pinned) layer 54 separated by an oxide barrier layer 53 or non-magnetic tunnel barrier. A first or bottom electrode 58 is in electrical contact with reference layer 54 and a second or top electrode 59 is in electrical contact with ferromagnetic free layer 52. A hard mask 57 is positioned above top electrode 59. An electrically insulating radial isolation layer 56 encircles free layer 52, hard mask 57 and top electrode 59. An antiferromagnetic pinning layer 55 radially encircles at least a portion of isolation layer 56 and the stack of barrier layer 53, free layer 52, top electrode 59 and hard mask 57. The various elements of cell 50 are similar to the element of cells 10A, 10B, 30 described above, except as noted.

In this embodiment of memory cell 50, reference layer 54 is larger than and extends past barrier layer 53, which in turn is larger than and extends past free layer 52. Reference layer 54, barrier 53 and free layer 52 are stacked with their centers aligned.

Figure 6:
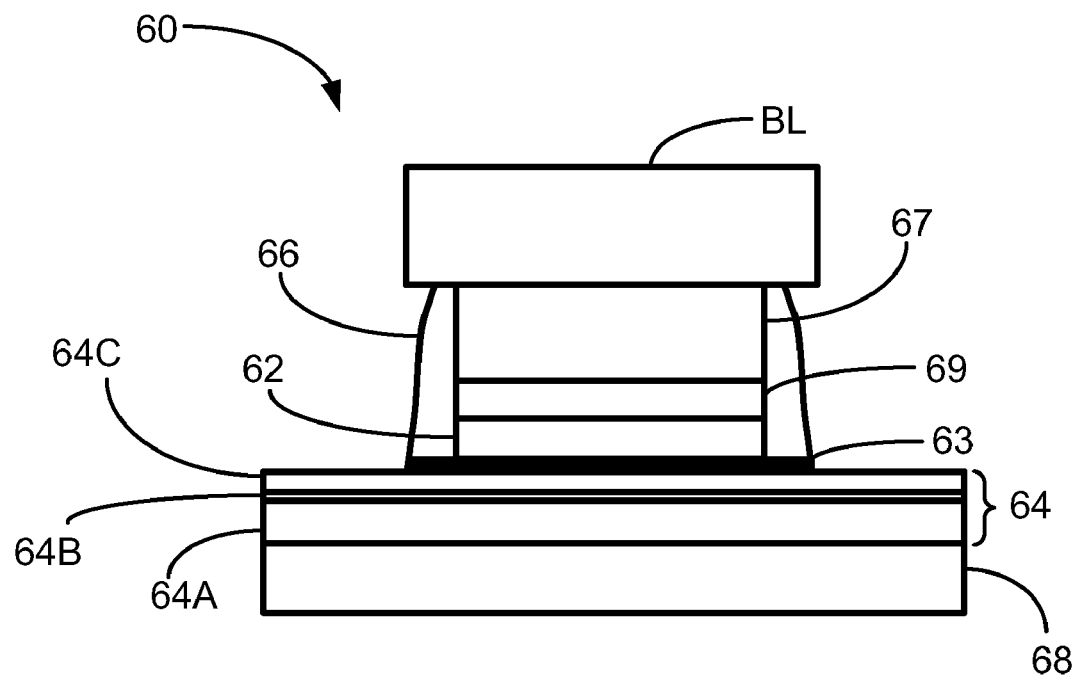
FIG. 6 is a cross-sectional schematic diagram of an embodiment of a magnetic cell.

FIG. 6 illustrates another embodiment of a memory cell having a pinned reference layer that is larger than and extends past the ferromagnetic free layer and that has an asymmetric SAF trilayer instead of a pinning layer. In particular, memory cell 60 has a soft ferromagnetic free layer 62 and an SAF trilayer reference (i.e., pinned) layer 64 separated by an oxide barrier layer 63 or non-magnetic tunnel barrier. A first or bottom electrode 68 is in electrical contact with trilayer 64 and a second or top electrode 69 is in electrical contact with ferromagnetic free layer 62. A hard mask 67 is positioned above top electrode 69. An electrically insulating radial isolation layer 66 encircles free layer 62, hard mask 67 and top electrode 69. The various elements of cell 60 are similar to the element of cells 10A, 10B, 30, 50 described above, except as noted.

Unlike memory cell 30 of FIG. 3 and cell 50 of FIG. 5, memory cell 60 has no antiferromagnetic layer for pinning. Rather, trilayer 64 (composed of a first ferromagnetic layer 64A, a metallic spacer 64B, and a second ferromagnetic layer 64C) is asymmetric in either physical thickness or coercivity between its ferromagnetic layers. That is, ferromagnetic layers 64A and 64C either have a different physical thickness or have a different coercivity. In FIG. 6, layer 64A is illustrated physically thicker than layer 64C. The magnetization configuration and orientation of trilayer 64 are defined after magnetic field setting. With no antiferromagnetic pinning layer in cell 60, trilayer 64 is designed in shape to induce shape anisotropy against thermal activation.

Figure 7:
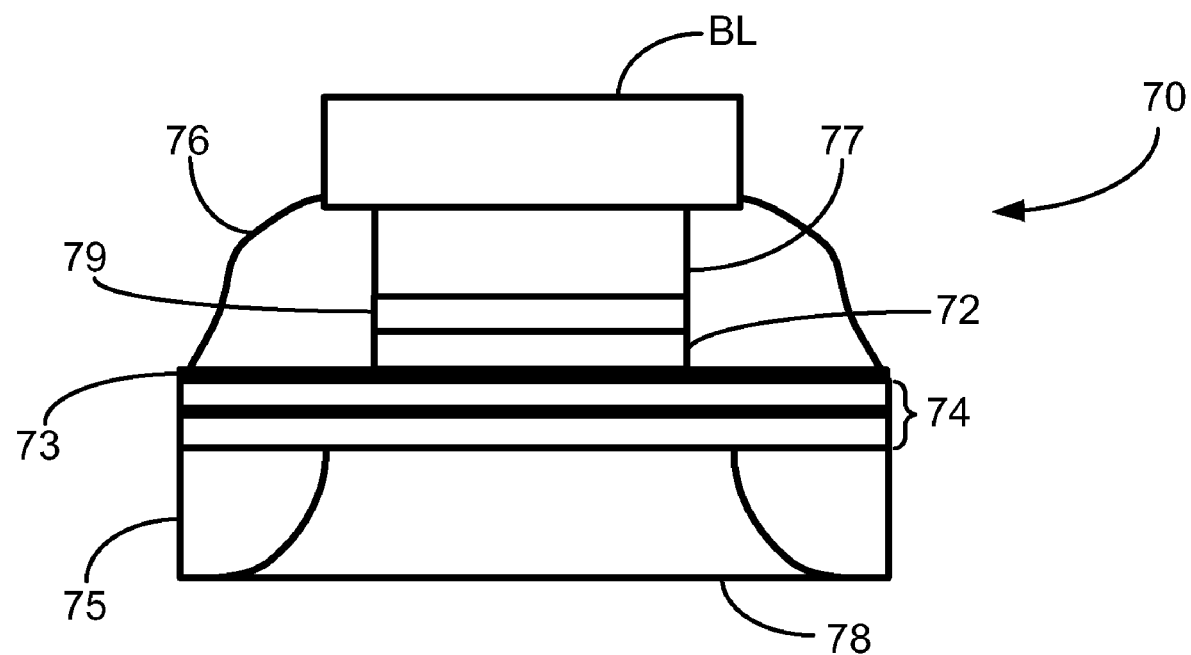
FIG. 7 is a cross-sectional schematic diagram of an embodiment of a magnetic cell.

FIG. 7 illustrates another embodiment of a memory cell having a pinned reference layer that is larger than and extends past the ferromagnetic free layer and having an annular pinning layer. In particular, memory cell 70 has a soft ferromagnetic free layer 72 and an SAF trilayer reference (i.e., pinned) layer 74 separated by an oxide barrier layer 73 or non-magnetic tunnel barrier. A first or bottom electrode 78 is in electrical contact with trilayer 74 and a second or top electrode 79 is in electrical contact with ferromagnetic free layer 72. A hard mask 77 is positioned above top electrode 79. An electrically insulating radial isolation layer 76 encircles free layer 72, hard mask 77 and top electrode 79. The various elements of cell 70 are similar to the element of cells 10A, 10B, 30, 50, 60 described above, except as noted.

Memory cell 70 includes a pinning layer 75 positioned below the stack of free layer 72, barrier layer 73, and trilayer 74. In this embodiment, pinning layer 75 is an annular ring at the outer periphery of bottom electrode 78, in physical contact with and exchange coupled with trilayer 74. In this embodiment, pinning layer 75 is centered around the stack of free layer 72, barrier layer 73, and trilayer 74 and does not vertically overlap or intersect with the stack.

Figure 8A:
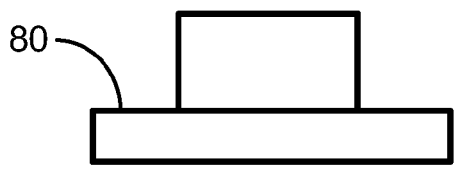
FIGS. 8A-8H illustrate a stepwise method for forming the magnetic cell of FIG. 7.
Figure 8B:
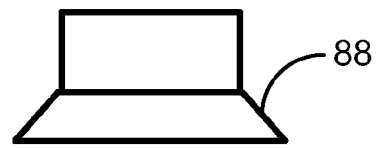
Figure 8C:
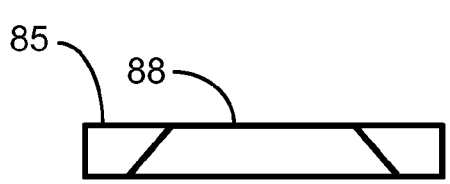
Figure 8D:
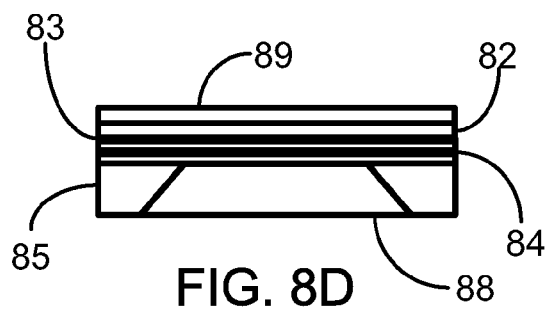
Figure 8E:
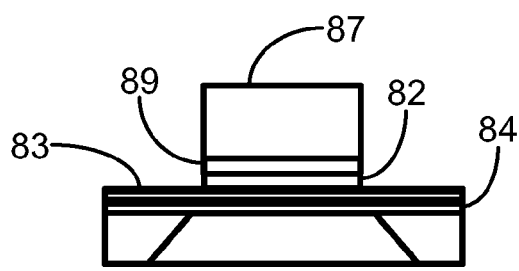

The process flow to make memory cell 70 is shown in FIGS. 8A-8H. First, in FIG. 8A, a metal layer 80 deposited, which will form the eventual bottom electrode. Metal layer 80 is masked and patterned (e.g., milled) to form bottom electrode 88 of FIG. 8B. In FIG. 8C, antiferromagnetic material is deposited in a ring around bottom electrode 88 and then polished to form pinning layer 85. An SAF trilayer 84, a barrier layer 83, a free layer 82 and top electrode 89 are sequentially formed in FIG. 8D over bottom electrode 88 and pinning layer 85. At this step, the various layers of pinning layer 85/bottom electrode 88, SAF trilayer 84, barrier layer 83, free layer 82 and top electrode 89 in the stack have the same diameter. In FIG. 8E, free layer 82 and top electrode 89 are masked with hard mask 87 and patterned, to have a reduced size in relation to SAF trilayer 84 and barrier layer 83.

Figure 8F:
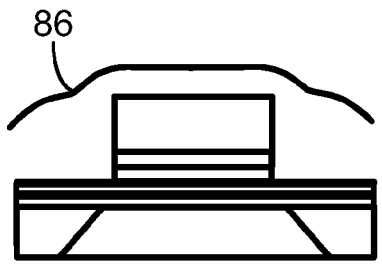
Figure 8G:
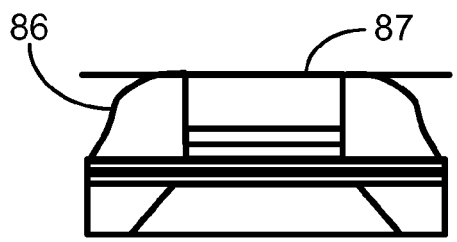
Figure 8H:
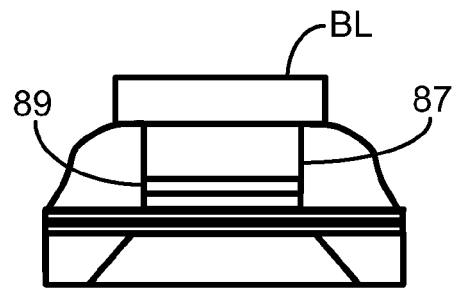

Isolation material 86 is deposited in FIG. 8F to cover and encase the structure of FIG. 8E. This isolation material 86 is optionally milled and then covered with a dielectric material, which is polished in FIG. 8G to provide a planar surface of hard mask 87 and isolation material 86. A bit line BL is deposited and patterned on top electrode 89 and hard mask 87 in FIG. 8H.

Figure 9:
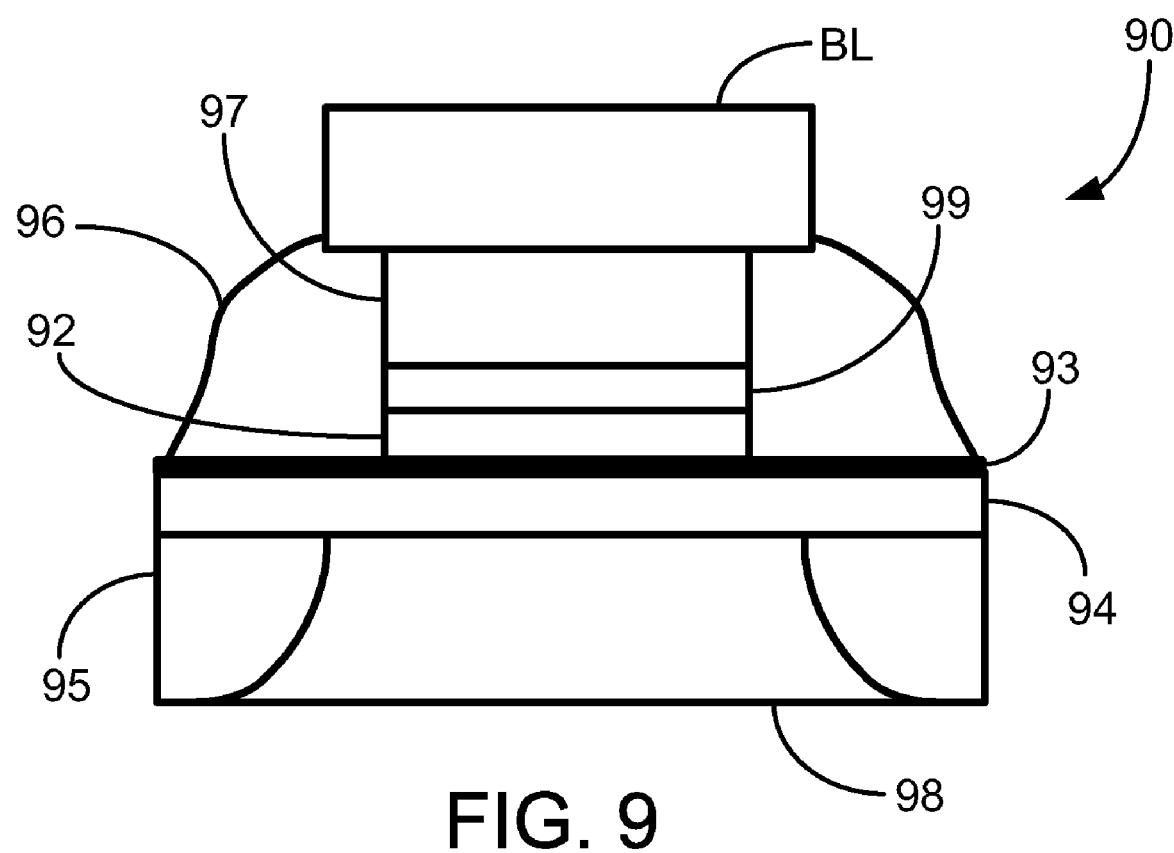
FIG. 9 is a cross-sectional schematic diagram of an embodiment of a magnetic cell.

An alternate to memory cell 70 of FIG. 7, with a single pinned reference layer, is shown in FIG. 9. Memory cell 90 of FIG. 9 has a soft ferromagnetic free layer 92 and a single layer reference (i.e., pinned) layer 94 separated by an oxide barrier layer 93 or non-magnetic tunnel barrier. A first or bottom electrode 98 is in electrical contact with layer 94 and a second or top electrode 99 is in electrical contact with free layer 92. A hard mask 97 is positioned above top electrode 99. An electrically insulating radial isolation layer 96 encircles free layer 92, hard mask 97 and top electrode 99. An annular pinning layer 95 is positioned below the stack of free layer 92, barrier layer 93, and layer 94. The various elements of cell 90 are similar to the element of cells 10A, 10B, 30, 50, 60, 70 described above, except as noted.

The structures of this disclosure, including any or all of the magnetic cells, may be made by thin film techniques such as chemical vapor deposition (CVD), physical vapor deposition (PVD), and atomic layer deposition (ALD). Material removal may be by etching, including milling, ion beam milling, wet etching, and the like.

Thus, embodiments of the MAGNETIC STACK DESIGN are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A magnetic stack comprising:
a ferromagnetic free layer having a switchable magnetization orientation, a ferromagnetic reference layer having a pinned magnetization orientation, and a barrier layer therebetween, each of the free layer, reference layer and barrier layer having a center; and
an annular antiferromagnetic pinning layer having a center, with the center of the pinning layer generally aligned with the center of each of the free layer, reference layer and barrier layer, the pinning layer electrically isolated from the free layer and in physical contact with the reference layer wherein the annular pinning layer encircles at least the free layer.

2. The magnetic stack of claim 1 wherein the reference layer has a larger area than the free layer.

3. The magnetic stack of claim 1 wherein the reference layer is a synthetic antiferromagnetic (SAF) trilayer.

4. The magnetic stack of claim 1 wherein the reference layer is a single ferromagnetic pinned layer.

5. The magnetic stack of claim 1 wherein the annular pinning layer encircles at least the free layer.

6. The magnetic stack of claim 5 further comprising an electrically insulating isolation layer between the annular pinning layer and the free layer.

7. The magnetic stack of claim 1 wherein the barrier layer has a larger area than the free layer.

8. The magnetic stack of claim 1 wherein the magnetic stack is a magnetic tunnel junction memory cell.

9. A magnetic stack comprising:
a ferromagnetic free layer having a switchable magnetization orientation, a ferromagnetic reference layer having a pinned magnetization orientation, and a barrier layer therebetween, and an antiferromagnetic pinning layer electrically isolated from the free layer and in physical contact with the reference layer;
with each of the free layer, reference layer, barrier layer and pinning layer having a center and an outer diameter, with the reference layer having a larger outer diameter than the free layer wherein the antiferromagnetic pinning layer encircles at least the free layer.

10. The magnetic stack of claim 9 wherein the barrier layer has a larger outer diameter than the free layer.

11. The magnetic stack of claim 9 wherein the reference layer is a synthetic antiferromagnetic (SAF) trilayer.

12. The magnetic stack of claim 9 wherein the pinning layer is annular and has an inner diameter.

13. The magnetic stack of claim 12 wherein the inner diameter of the pinning layer is larger than the outer diameter of the free layer.

14. The magnetic stack of claim 9 further comprising an electrically insulating isolation layer between the annular pinning layer and the free layer.

* * * * *